United States Patent [19]
Khoury

[11] Patent Number: 5,917,440
[45] Date of Patent: Jun. 29, 1999

[54] IMPLEMENTING TRANSMISSION ZEROES IN NARROWBAND SIGMA-DELTA A/D CONVERTERS

[75] Inventor: John Michael Khoury, New Providence, N.J.

[73] Assignee: Lucent Technologies Inc., Murray Hill, N.J.

[21] Appl. No.: 08/777,644

[22] Filed: Dec. 31, 1996

[51] Int. Cl.[6] .................................................. H03M 1/12
[52] U.S. Cl. ........................................ 341/143; 341/122
[58] Field of Search .................................. 341/143, 155, 341/122

[56] References Cited

U.S. PATENT DOCUMENTS

| | | | |
|---|---|---|---|
| 4,268,793 | 5/1981 | Amazawa et al. | 328/165 |
| 4,517,518 | 5/1985 | Ishigaki | 328/156 |
| 4,590,458 | 5/1986 | Evans et al. | 341/122 |
| 4,684,922 | 8/1987 | Minogue | 341/122 |
| 4,994,804 | 2/1991 | Sakaguchi | 341/143 |
| 5,392,039 | 2/1995 | Thurston | 341/143 |
| 5,521,599 | 5/1996 | McCarroll et al. | 341/122 |
| 5,608,400 | 3/1997 | Pellon | 341/143 |
| 5,673,044 | 9/1997 | Pellon | 341/143 |
| 5,682,161 | 10/1997 | Ribner et al. | 341/143 |

OTHER PUBLICATIONS

"Multibit Bandpass Delta–Sigma Modulators Using N–path Structures", by Schreir and B.R. Hong et al., IEEE International Symposium on Circuits & Systems, 1992.
"A 15b 30kHz Bandpass Sigma–Delta Modulator", by L. Longo et al., IEEE International Solid–State Circuits Conference, 1993.
"Multistage Bandpass Delta Sigma Modulators", by Ribner, IEEE Transactions on Circuits and Systems, 1994, discloses an architecture for oversampled delta sigma A/D converts.
Delta–Sigma Data Converters Chapter 9, by Norsworthy, Schreier and Temes, IEEE Press Marketing, 1996.

*Primary Examiner*—Marc S. Hoff
*Assistant Examiner*—Peguy JeanPierre

[57] ABSTRACT

In accordance with the present invention, circuits are disclosed for use in implementing higher order sigma delta analog to digital conversion of narrowband signals with cascaded lower order circuit networks. The lower order circuit networks employ resonator circuits utilizing unit delay functional blocks to implement a specific transfer function. The unit delays are implemented utilizing sample and hold circuits operated by controlled switching of the circuit elements. In one embodiment, the resonator circuit includes a first sample and hold circuit for implementing a unit delay of corresponding input signals where the output of the first sample and hold circuit is coupled into a feedback loop with one or more additional sample and hold circuits for implementing a dual cascaded unit delay. The delayed signals from the feedback loop are then summed with the input signals at the input of the first sample and hold circuit. Advantageously, the present invention overcomes performance limitations of complex higher order sigma delta analog to digital converters that suffer from circuit nonidealities such as component mismatch, finite operational amplifier gain, bandwidth and design complexities associated with integrator based implementations. Alternate embodiments of the present invention include a switched capacitor based circuit for implementing the lower order delay function block based networks and a current copier or switched current approach. The switched capacitor circuit employs a first operational amplifier for inputting signals and summing with delayed samples of the input signals and a second operational amplifier coupled in a feedback loop with the first operational amplifier for implementing the delayed samples of the input signals. The switched current circuit employs a first current copier for sampling input signals and summing with a delay of the input signals. Second and third current copiers are used for implementing delayed sampling and holding for two separate signals output from the first current copier. The sampling, holding, delaying and summing are implemented with controlled switching in the circuits.

36 Claims, 8 Drawing Sheets

IMPLEMENTING TRANSMISSION ZEROES IN NARROWBAND SIGMA-DELTA A/D CONVERTERS

FIELD OF THE INVENTION

This invention relates to the field of analog to digital converters and more particularly to sigma-delta based analog to digital conversion of narrowband signals.

BACKGROUND OF THE INVENTION

Sigma-delta modulation has become the preferred method for performing high resolution analog to digital (A/D) conversion on narrowband signals. Traditional low pass sigma-delta modulation techniques have been extended to bandpass A/D converters ideally suited for converting the narrowband Intermediate Frequencies (IF) found in wireless systems. Such narrowband A/D converters are particularly well suited to superheterodyne radio architecture. The resolution obtainable in such bandpass A/D converters is dependent on several factors including the method of implementing the transmission zeroes in the noise transfer function. Analog to digital converters based on known single bit type sigma delta modulators are inherently linear but the accompanying quantization noise is only small for low frequencies and undesirably high at higher signal frequencies. The high and low frequencies are relative to the sampling clock frequency.

Certain circuit designs for performing bandpass sigma-delta modulation have used switched capacitor techniques that depend on ratio matching of the capacitors to place the transmission zeros at a quarter of the sampling rate ($f_s/4$). This is desirable, since simple resonator circuit implementations are possible when operating bandpass modulators at $f_s/4$. Some switched capacitor techniques, however, have shown degraded performance due to capacitor mismatch effects. Bandpass sigma-delta modulators implemented with switched capacitor technology require a capacitor ratio tolerance on the order of the ratio of the desired signal bandwidth to the frequency of the signal being converted. For moderately narrowband signals this requirement has proved to be barely tolerable and, for extremely narrowband signals this requirement has been too stringent.

Several articles exist in the prior art which relate bandpass sigma-delta modulation techniques. For example, an article entitled "Multibit Bandpass Delta-Sigma Modulators Using N-path Structures", by Schreir and B. R. Hong et al., IEEE International Symposium on Circuits & Systems, 1992, discloses the use of multibit quantization to overcome the quantization noise power problems associated with single bit sigma-delta modulators. An article entitled "A 15b 30 kHz Bandpass Sigma-Delta Modulator", by L. Longo et al., IEEE International Solid-State Circuits Conference, 1993, discloses the use of bandpass filters with infinite Q's as opposed to integrators used in lowpass modulators. An article entitled "Multistage Bandpass Delta Sigma Modulators", by Ribner, IEEE Transactions on Circuits and Systems, 1994, discloses an architecture for oversampled delta sigma A/D converters.

These articles, in part, disclose methods and circuits for implementing bandpass sigma delta based analog to digital conversions which rely on high order transfer functions realized by integrator based and/or unity gain delay circuits. However, the performance of these integrator based circuits are limited by design complexity, capacitor component mismatching, finite operational amplifier gain and bandwidth. Accordingly, there is a need to provide a circuit for implementing transmission zeros optimally in sigma delta based analog to digital conversion of narrowband signals.

SUMMARY OF THE INVENTION

In accordance with the present invention, circuits are disclosed for use in implementing higher order sigma delta analog to digital conversion of narrowband signals with cascaded lower order circuit networks. The lower order circuit networks employ resonator circuits utilizing unit delay functional blocks to implement a specific transfer function. The unit delays are implemented utilizing sample and hold circuits operated by controlled switching of the circuit elements.

In one embodiment, the resonator circuit includes a first sample and hold circuit for implementing a unit delay of corresponding input signals where the output of the first sample and hold circuit is coupled into a feedback loop with one or more additional sample and hold circuits for implementing a dual cascaded unit delay. The delayed signals from the feedback loop are then summed with the input signals at the input of the first sample and hold circuit. Advantageously, the present invention overcomes performance limitations of complex higher order sigma delta analog to digital converters that suffer from circuit nonidealities such as component mismatch, finite operational amplifier gain, bandwidth and design complexities associated with integrator based implementations.

Alternate embodiments of the present invention include a switched capacitor based circuit and a current copier or switched current approach for implementing the resonator circuits or other lower order delay function block based networks. The switched capacitor circuit employs a first operational amplifier for inputting signals and summing with delayed samples of the input signals and a second operational amplifier coupled in a feedback loop with the first operational amplifier for implementing the delayed samples of the input signals. The switched current circuit employs a first current copier for sampling input signals and summing with a delay of the input signals. Second and third current copiers are used for implementing delayed sampling and holding for two separate signals output from the first current copier. The sampling, holding, delaying and summing are implemented with controlled switching in the circuits.

BRIEF DESCRIPTION OF THE DRAWINGS

A more complete understanding of the present invention may be obtained from consideration of the following description in conjunction with the drawings in which.

DETAILED DESCRIPTION

Figure 1:
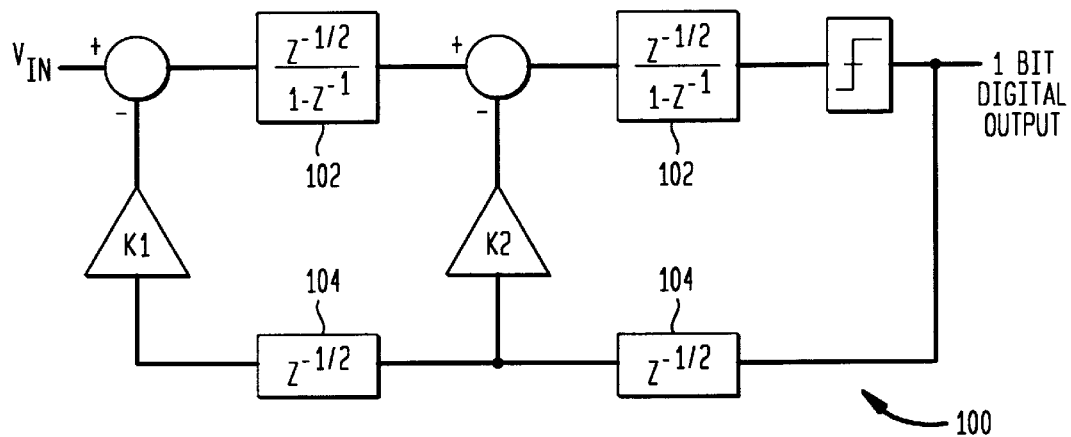
FIG. 1 is a block diagram of a standard, second order sigma-delta converter.
Figure 2:
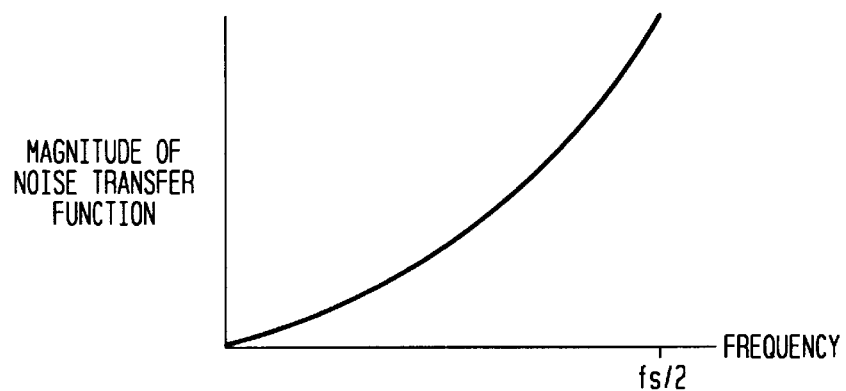
FIG. 2 is a frequency response diagram of the noise transfer function of the circuit in FIG. 1.
Figure 3:
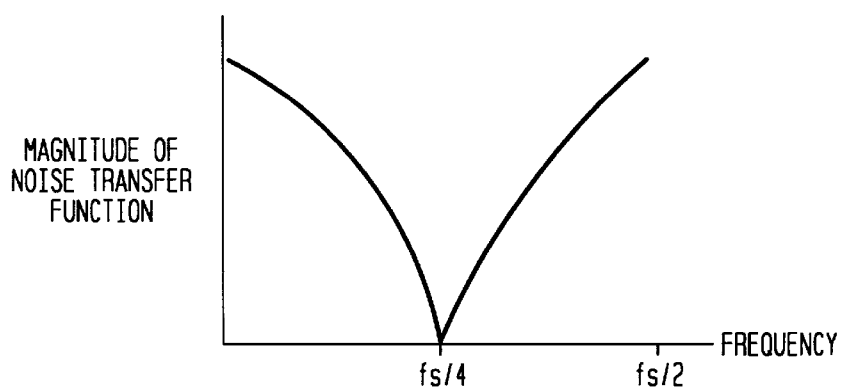
FIG. 3 is the output of the noise transfer function for the specific case of narrowband analog to digital conversion at a quarter of the sampling rate ($f_s/4$).

A standard sigma-delta based analog-to-digital converter uses high oversampling rates and noise shaping to place the noise transfer function zeroes at DC. The use of integrators, which have infinite gain at DC in theory, makes possible noise transmission zeroes at DC. The block diagram of a standard second-order loop design 100 is shown in FIG. 1, with two transfer function blocks 102 indicated as $z^{-1/2}/(1-z^{-1})$, i.e., integrators, with cascaded negative feedback loops of $z^{-1/2}$ transfer function blocks 104 fed through amplifiers $K_1$ and $K_2$. The single bit digital output has the digitized version of the analog input $V_{IN}$. The transfer functions are shown in z transform representation which entails a known analysis method for discrete time systems or sampled data analog systems. As shown in FIG. 2, the quantization noise is zero at DC or zero frequency and rises to its maximum value at $f_s/2$, where $f_s$ is the sample rate. By performing a low pass to bandpass conversion on the filter functions (for example, the integrators) the zeroes of the noise transfer function can be moved to higher frequencies allowing the sigma-delta converter to perform A/D conversion on narrowband signals at frequencies much higher than DC. (This idea was published by Shrier & Snelgrove in "Bandpass Sigma-Delta Modulation, IEE Electronic Letters, Vol. 25, No. 23, pp 1560–1561, Nov. 9, 1989). As shown in FIG. 3, for a specific case of narrowband A/D conversion at $f_s/4$, the desired noise transfer function implements transmission zeroes at $f_s/4$. The transmission zeros at $f_s/4$ prevent quantization noise from appearing at $f_s/4$ through high attenuation in this region. Hence, any input signals in this frequency range can be converted to digital form with high signal to noise ratio, i.e., high resolution.

Figure 4:
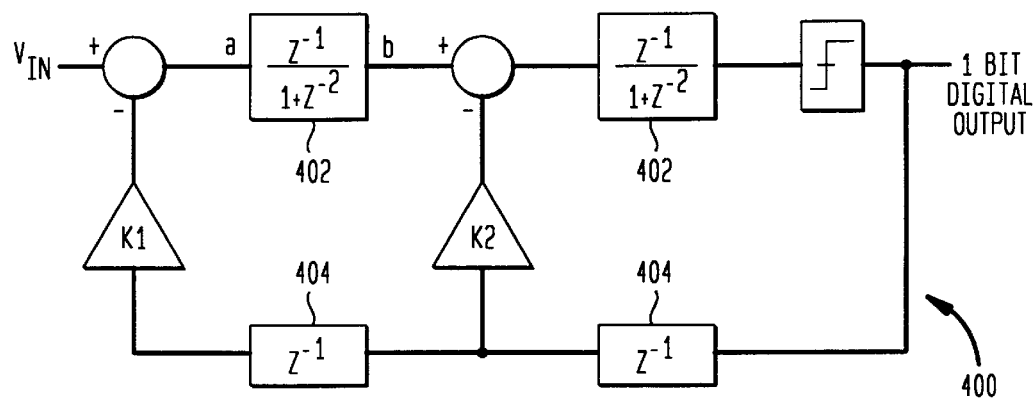
FIG. 4 shows a fourth order sigma-delta loop that implements a bandpass analog to digital conversion at $f_s/4$.

Referring now to FIG. 4 there is shown a lowpass to bandpass transformation for a fourth order sigma-delta loop 400 implementing a bandpass analog to digital conversion at $f_s/4$. The fourth order converter consists of a two stage loop employing $z^{-1}/(1+z^{-2})$ resonator transfer function blocks 402 with negative feedback loops employing $z^{-1}$ transfer function blocks 404 fed through amplifiers $K_1$, and $K_2$. The noise transfer function (NTF) for this design will have infinite attenuation at a frequency equal to $f_s/4$, if the resonator function blocks $z^{-1}/(1+z^{-2})$ exactly implement the transfer function poles at $z=\pm j$ on the complex plane diagram.

Figure 5:
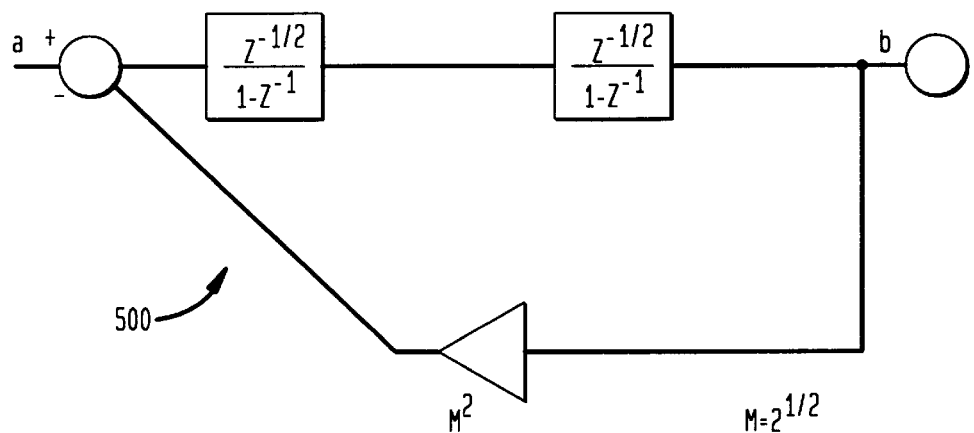
FIG. 5 shows one possible implementation of the resonator function block of FIG. 4.
Figure 6:
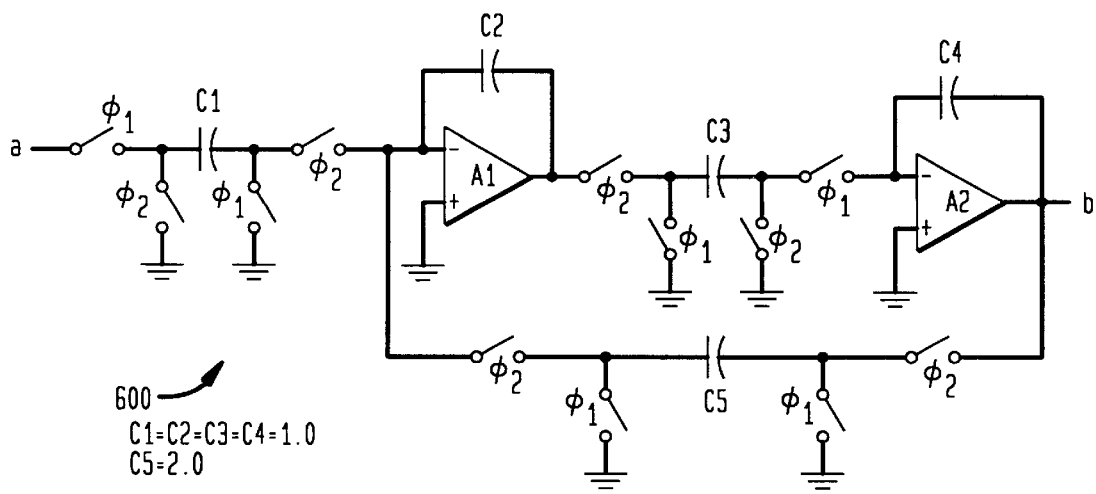
FIG. 6 is a switched capacitor circuit implementation of the loop of FIG. 5.
Figure 7:
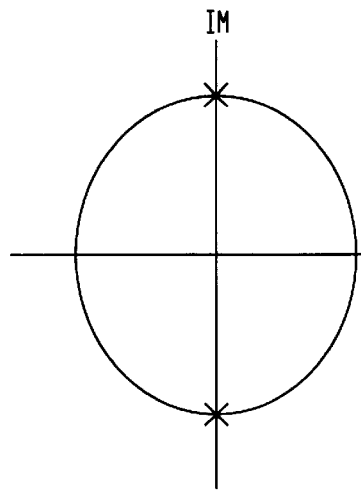
FIG. 7 shows the ideal pole locations in the z-plane for the circuit of FIG. 6.

For the block diagram 500 in FIG. 5, the straight forward manner for implementing transfer function poles at $z=\pm j$ at $f_s/4$, in analog CMOS using integrators with a switched capacitor circuit 600, employs a lossless discrete integrator with switched capacitors as shown in FIG. 6. In the ideal case, this circuit 600 with $V_{IN}=0$ implements an oscillator with a frequency of oscillation equal to a quarter of the sampling frequency ($f_s/4$). Ideally, the poles are located at $z=\pm j$, as shown in FIG. 7.

Figure 8:
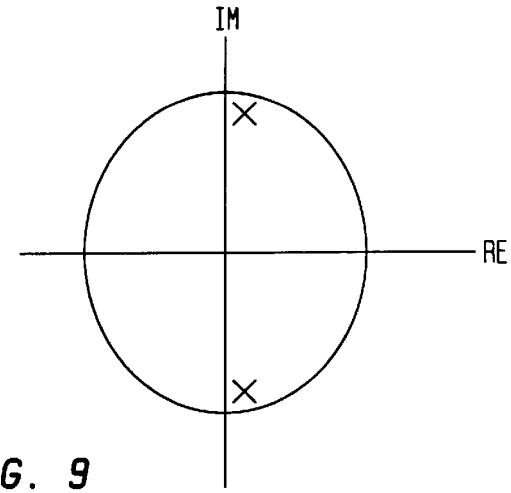
FIG. 8 is a z-plane pole diagram for the circuit in FIG. 6 showing the effects of finite operational amplifier gain.
Figure 9:
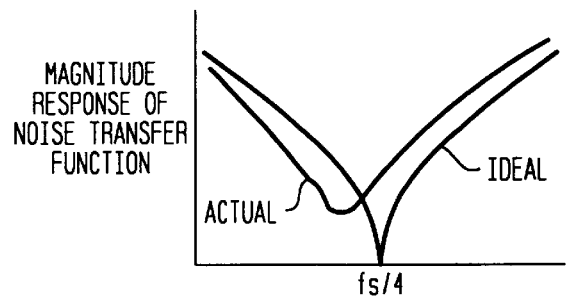
FIG. 9 is the plot of the noise transfer function for the circuit of FIG. 4 for both the ideal and actual resonator of FIGS. 7 and 8, respectively.
Figure 10:
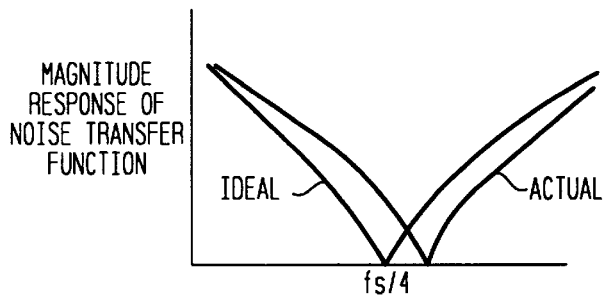
FIG. 10 is a frequency response diagram of the noise transfer function of the circuit of FIG. 4 illustrating effects of capacitor mismatch.

With implementation of the circuit of FIG. 6, mathematically described in FIG. 5, two non-ideal effects occur due to operational amplifier finite gain and capacitor mismatch errors. In the actual case, with everything being ideal except for operational amplifiers $A_1$ and $A_2$ having finite gain, the integrators are lossy and the poles on the z plane move slightly in from the unit circle, as shown in FIG. 8. As shown in FIG. 9, the noise transfer response for the actual case due to finite operational amplifier gain does not have infinite attenuation of the noise and the maximum attenuation occurs at a frequency less than $f_s/4$. Although the operational amplifier finite gain has caused the quantization noise to increase at $f_s/4$ and will result in less resolution for the A/D converter, achieving adequate operational amplifier gain, e.g., above 60 decibels (dB), is possible with known circuit techniques. Also, as shown in FIG. 10, capacitor mismatch can cause the noise transfer function to produce transmission zeroes at a frequency other than $f_s/4$. This curve can create a great error in resolution if the basic loop gain of each resonator is not 2.0, i.e., $M=\sqrt{2}$, where M equals the gain of the amplifier. For example, for a narrowband analog to digital converter at a center frequency of 50 MHz with a bandwidth of 200 kHz, capacitor errors on the order of 1% could cause a 500 kHz offset in the quantization noise transfer function and severe loss of resolution for the sigma-delta analog to digital conversion.

Figure 11:
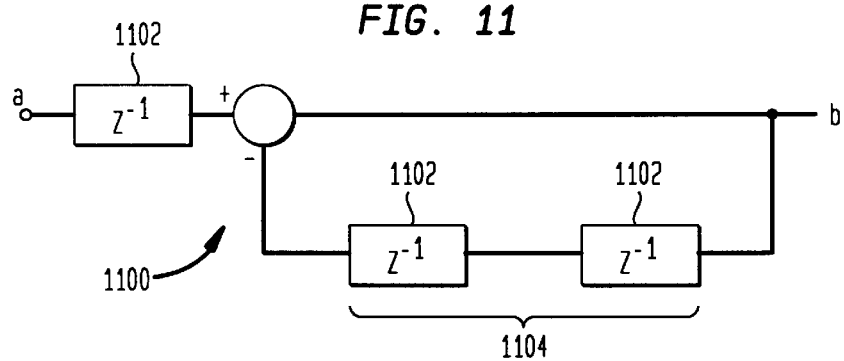
FIG. 11 is a block diagram for implementing the resonator block functions of transfer function of FIG. 5 with only single delay transfer blocks.

A solution for minimizing the non-ideal effects of capacitor mismatch in a switched capacitor implementation or resonator loop gain errors in the general case (see FIG. 5), resides in implementing the resonator functions $z^{-1}/(1+z^{-2})$ with unit delay $z^{-1}$ transfer function blocks according to the block diagram 1100 shown in FIG. 11. The input signal a it fed through the $z^{-1}$ transfer function block 1102 with a negative feedback loop containing two cascaded $z^{-1}$ function blocks 1104. The difference equation for this block diagram 1100 in terms of a and b is $b(z)=z^{-1}a(z)-z^{-2}b(z)$, or $b(n)=a(n-1)-b(n-2)$ after converting $z^{-1}$ and $z^{-2}$ to their discrete sampling equivalents. The transfer function blocks $z^{-1}$ and $z^{-2}$ are one and two unit delays, attained by delaying samples of signals by one and two sampling intervals, respectively. The $z^{-2}$ delay is attained by cascaded unit delay elements to simplify implementation circuitry. Since only delay elements are used and realized by sample and hold circuits not depending on component ratios, zeros of the noise transfer function (NTF) are implemented at a quarter of the sampling frequency ($f_s/4$) and can be made independent of capacitor mismatch tolerances or other gain errors in the individual resonators.

Figure 11A:
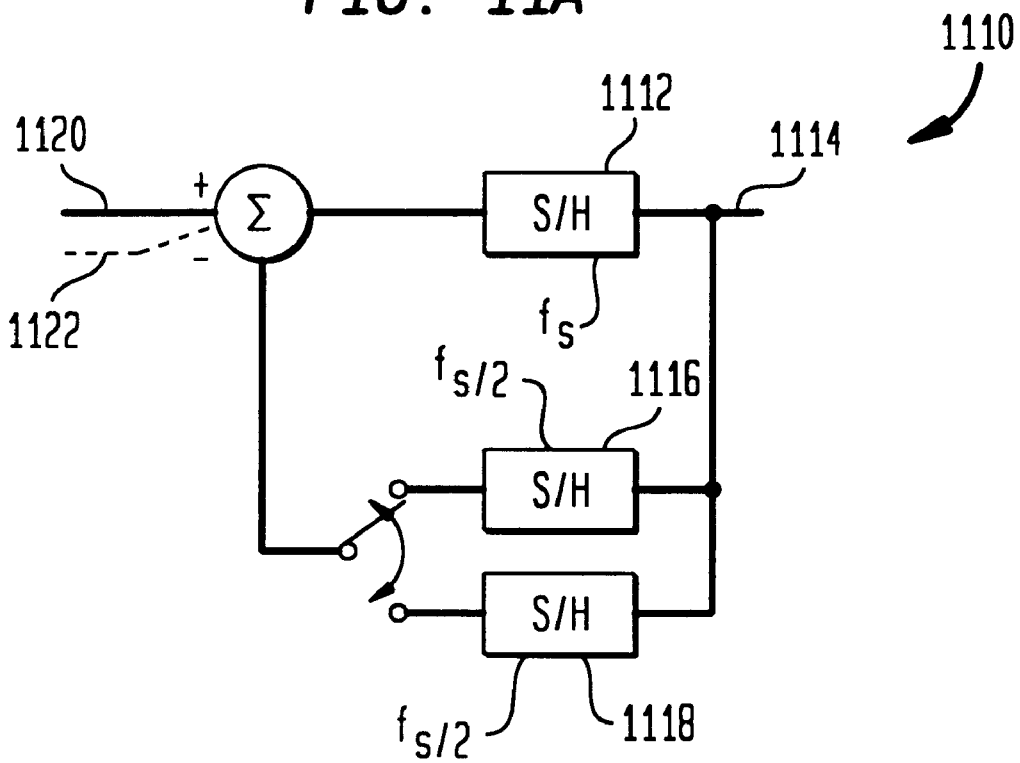
FIG. 11A is a higher order circuit diagram for implementing the resonator block function of FIG. 11.

Referring to FIG. 11A, an exemplary illustration is shown of a higher level circuit 1110 for implementing the block diagram shown in FIG. 11. The circuit includes a first sample and hold circuit 1112 which is sampled at a first sampling frequency $f_s$ and which provides an output signal at an output terminal 1114. The output of the first sample and hold circuit is coupled in a feedback loop to an input of a second and third sample and hold circuit 1116, 1118, respectively, each of which sample and hold circuits 1116, 1118 are sampled at a second sampling frequency, for example, $f_s/2$.

The outputs of the second and third sample and hold circuits 1116, 1118 are alternately coupled into the feedback loop to the input of the first sample and hold circuit according to the second sampling frequency. A summation then occurs at the input of the first sample and hold circuit 1112 consisting of the signal output from the feedback loop and one or more input signals present at terminals 1120, 1122, for example. As would be understood, the first sample and hold circuit implements a first delay interval for signals present at its input and the feedback loop including the second and third sample and hold circuits implement a second delay interval equivalent to two sampling intervals, i.e., the cascaded unit delays. As will be explained the circuit in FIG. 11A may be implemented utilizing a switched capacitor approach where the first sample and hold circuit includes a first amplifier circuit and the second and third sample and hold circuits are implemented utilizing a second shared amplifier circuit. Alternately, the circuit may be implemented utilizing current copier circuits.

Figure 12:
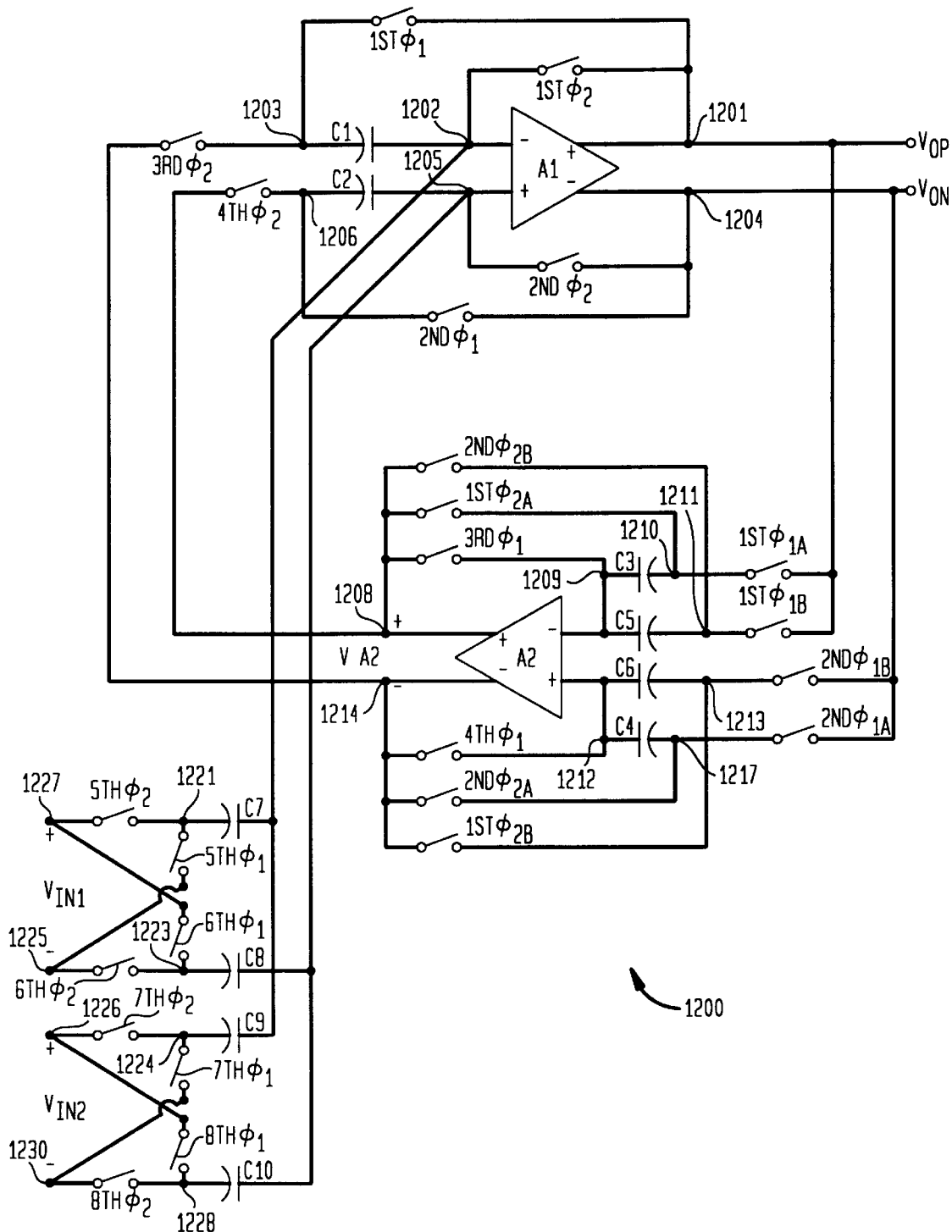
FIG. 12 is a switched capacitor circuit implementation of the block diagram in FIG. 11.

Referring now to FIG. 12 there is shown one exemplary embodiment of a switched capacitor circuit 1200 for implementing the resonator transfer function $(z^{-\frac{1}{2}})(1+z^{-2})$, but with two input signals and the input delay being $z^{-\frac{1}{2}}$. It is noted that the lack of $z^{-1}$ in the numerator does not present a problem as blocks 404 in FIG. 4 can be replaced with $z^{-\frac{3}{2}}$. A sample and hold circuit includes a first operational amplifier A1 having an inverting input (−) at terminal 1202, a noninverting input (+) at terminal 1205, a noninverting voltage output at terminal 1201, designated $V_{OP}$, and an inverting output at terminal 1204, designated $V_{ON}$. Examples of suitable operational amplifiers are well known in the art. Amplifier A1 does the sample and hold function and summation of signals from A2, $V_{IN1}$ and $V_{IN2}$. Essentially, an operational amplifier is a high gain device and many suitable amplifiers are commercially available. The operating characteristics of amplifiers such as A1 are well understood. Shunting the amplifier A1, from terminals 1201 to 1202 and from terminals 1204 to 1205 are phase 2 (Φ2) switches. A capacitor C1 is connected at one end to terminal 1202 of the inverting input to A1, and at the other end to terminal 1203 of a phase 1 (Φ1) switch, which switch in turn is connected at its other end to the noninverting output 1201 of A1. A capacitor C2 is connected at one end to terminal 1205 of the noninverting input of A1 and at its other end to terminal 1206 of a phase 1 (Φ1) switch, which switch in turn is connected at its other end to the inverting output terminal 1204 of amplifier A1.

A delay circuit fed by the output terminals from the sample and hold circuit includes an operational amplifier A2 having an inverting input (−) at terminal 1209, a noninverting input (+) at terminal 1212, a noninverting output at terminal 1208, and an inverting output at terminal 1214. The potential across the amplifier A2 output terminals 1208 and 1214, designated VA2, is fed through phase 2 (Φ2) switches to the terminals 1203 and 1206 of capacitors C1 and C2 respectively. Shunting the amplifier A2, from terminals 1208 to 1209, and terminals 1214 to 1212 are phase 1 (Φ1) switches. A capacitor C3 is connected at one end to terminal 1209 and at the other end to terminal 1210 of a phase 1A (Φ1A) switch which in turn is connected at the other end to terminal 1201. A capacitor C5 is connected at one end to terminal 1209 and at the other end to terminal 1211 of a phase 1B (Φ1B) switch which in turn is connected at its other end to terminal 1201. Shunting the phase 1 (Φ1) switch and capacitor C3 from terminal 1208 to terminal 1210 is a phase 2A (Φ2A) switch, and shunting the amplifier A2 and capacitor C5 from terminals 1208 to terminal 1211 is a phase 2B (Φ2B) switch. A capacitor C4 is connected at one end to terminal 1212 and at the other end to terminal 1217 of a phase 1A (Φ1A) switch which in turn is connected at its other end to terminal 1204. A capacitor C6 is connected at one end to terminal 1212 and at the other end to terminal 1213 of a phase 1B (Φ1B) switch which in turn is connected at its other end to terminal 1204. Shunting a phase 1 (Φ1) switch and capacitor C4 from terminal 1214 to terminal 1217 is a phase 2A (Φ2A) switch, and shunting the amplifier A2 and capacitor C6 from terminals 1214 to 1213 is a phase 2B (Φ2B) switch.

The switched capacitor circuit implementation provides for processing two input signals $V_{IN1}$ and $V_{IN2}$. The first input signal $V_{IN1}$ is supplied across terminals 1227 and 1225 and fed through phase 2 (Φ2) switches which are in turn connected at their other ends to capacitors C7 and C8 at terminals 1221 and 1223, respectively. Terminal 1221 is connected to a phase 1 (Φ1) switch which is connected at its other end to terminal 1225. Another phase 1 (Φ1) switch connected to terminal 1223 is coupled to terminal 1227 in order that when appropriate, fifth and sixth phase 1 switches may be connected to an opposite phase of the input voltage. $V_{IN2}$ is supplied across terminals 1226 and 1230 and fed through phase 2 (Φ2) switches which are in turn connected at their other ends to capacitors C9 and C10 at terminals 1224 and 1228, respectively. Terminal 1224 is connected to a phase 1 (Φ1) switch which is connected at its other end to terminal 1230. Another phase 1(Φ1) switch connected to terminal 1228 is coupled to terminal 1226 to allow for coupling of terminal seventh and eighth phase 1 switches to couple to an opposite phase of the input voltage. Capacitors C7 and C9 are connected at their other ends to terminal 1202, the inverting input to amplifier A1. Capacitors C8 and C10 are connected at their other ends to terminal 1205, the noninverting input to amplifier A1. In an alternate embodiment of the present invention, respective ends of the fifth, sixth, seventh and eighth phase one switches may each be coupled to signal ground instead of being coupled to respective input terminals.

The resonator of FIG. 12 has two sets of inputs, $V_{IN1}$ and $V_{IN2}$, to permit signal summation to occur in this block. Referring to the sigma delta modulator of FIG. 4, $V_{IN}$ and the output of the multiplier, K1, are shown summed externally to the first resonator. Use of the structure in FIG. 12 permits $V_{IN}$ to be summed via capacitors C7 and C8 into the resonator and the output of the amplifier, K1, to be summed with capacitors C9 and C10. By scaling the capacitors C9, C10 relative to C7 and C8 the gain K1 can be implemented.

Figure 13:
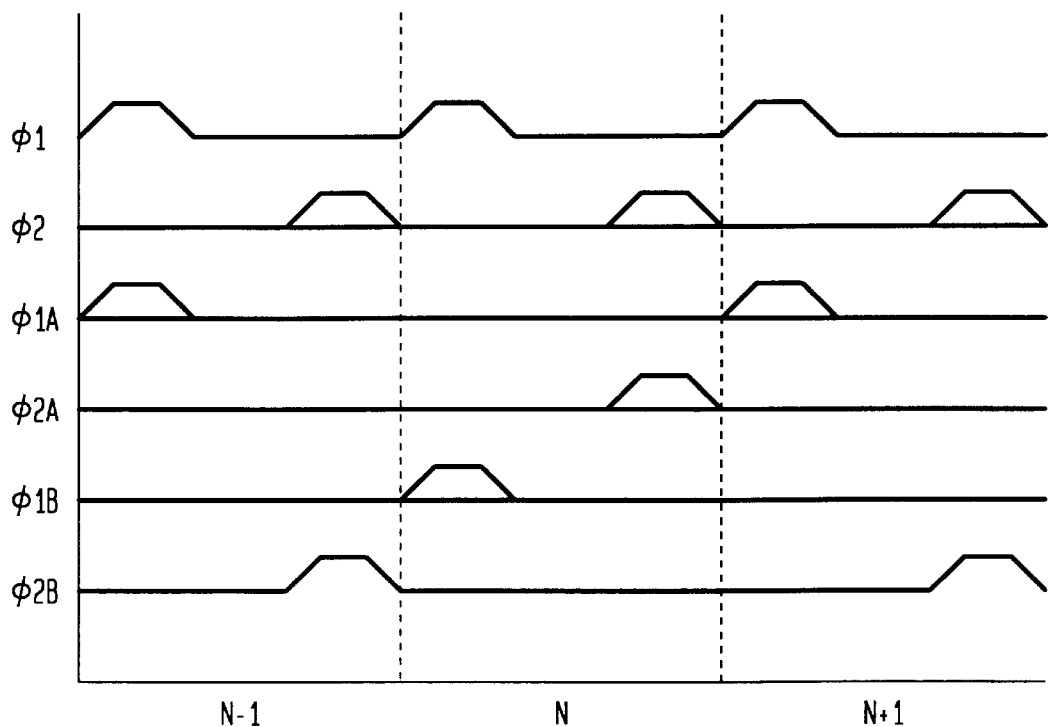
FIG. 13 is a timing diagram for the switches in the circuit of FIG. 12.

In accordance with the timing diagram in FIG. 13, phase switches are changed in pairs as follows: $\Phi_1$ and $\Phi_{1A}$ switches, $\Phi_2$ and $\Phi_{2B}$ switches, $\Phi_1$ and $\Phi_{1B}$ switches, and $\Phi_2$ and $\Phi_{2A}$ switches. During changes in phase $\Phi_1$ and $\Phi_{1A}$ switches, capacitors C1 and C2 which had been charged up to voltage $V_{A2}$ during the previous phase, i.e. $\Phi_2$, are placed in the feedback loop of amplifier A1. Capacitor C1 is now connected to terminal 1202 and $V_{OP}$, and capacitor C2 is connected to terminal 1205 and $V_{ON}$. Capacitors C7 and C8 which had been charged up to the input $V_{IN1}$ in the previous phase, i.e., $\Phi_2$, are now connected between opposite phases of the signal input and terminals 1202 and 1205, respectively. The charge on capacitor C7 is transferred to capacitor C1 and the charge on capacitor C8 is transferred to capacitor C2. In a like manner, the charge on capacitors C9 and C10, which was realized by sampling $V_{IN2}$ in the previous phase, i.e., $\Phi_2$, is now transferred to capacitors C1 and C2, respectively. At this instant, the output, $V_{OP}$ and $V_{ON}$, represents a weighted summation of $V_{A2}$, $V_{IN1}$, and $V\text{ IN}_2$.

Simultaneously, the voltage produced at $V_{OP}$, $V_{ON}$ is coupled to capacitors C3 and C4. These capacitors develop a charge proportional to these voltages since A2 has terminals 1208 and 1209 shorted, as well as terminals 1212 and 1214, producing a virtual signal ground at terminals 1209 and 1212.

During changes in phase $\Phi_2$ and $\Phi_{2B}$ switches, capacitors C5 and C6, which had developed charge proportional to $V_{OP}$ and $V_{ON}$, during phase $\Phi_{1B}$, are placed in the feedback loop of amplifier A2 to realize a hold mode operation. Capacitor C5 is connected from terminals 1208 to 1209, and capacitor C6 is connected from terminals 1212 to 1214. In this hold operation, the voltage $V_{A2}$ equals the voltage, $V_{OP}$-$V_{ON}$, that had occurred previously in phase $\Phi_{1B}$. Simultaneously, capacitors C1 and C2 develop a charge proportional to $V_{A2}$, since amplifier A1 terminals 1205 and 1202 are providing a virtual signal ground due the negative feedback connection of terminals 1201 to 1202 and terminals 1204 to 1205. Additionally, capacitors C7 and C8 develop a charge proportional to $V_{IN1}$ and capacitors C9 and C10 develop a charge proportional to $V_{IN2}$.

During changes in phase $\Phi_1$ and $\Phi_{1B}$ switches, capacitors C1 and C2 which had been charged up to voltage $V_{A2}$ during the previous phase, i.e. $\Phi_2$, are placed in the feedback loop of amplifier A1. Capacitor C1 is now connected to terminal 1202 and $V_{OP}$, and capacitor C2 is connected to terminal 1205 and $V_{ON}$. Capacitors C7 and C8 which had been charged up to the input $V_{IN1}$ in the previous phase, i.e., $\Phi_2$, are now connected between opposite phases of the input voltage and terminals 1202 and 1205. The charge on capacitor C7 is transferred to capacitor C1 and the charge on capacitor C8 is transferred to capacitor C2. In a like manner, the charge on capacitors C9 and C10, which was realized by sampling $V_{IN2}$ in the previous phase, i.e., $\Phi_2$, is now transferred to capacitors C1 and C2, respectively. At this instant, the output, $V_{OP}$ and $V_{ON}$, represents a weighted summation of $V_{A2}$, $V_{IN1}$, and $V_{IN2}$. Simultaneously, the voltage produced at $V_{OP}$, $V_{ON}$ is connected to capacitors C5 and C6. These capacitors develop a charge proportional to these voltages since A2 has terminals 1208 and 1209 shorted, as well as terminals 1212 and 1214, producing a virtual signal ground at 1209 and 1212.

During changes in phase $\Phi_2$ and $\Phi_{2A}$ switches, capacitors C3 and C4, which had developed charge proportional to $V_{OP}$ and $V_{ON}$ during phase $\Phi_{1A}$, are placed in the feedback loop of amplifier A2 to realize a hold mode operation. Capacitor C3 is connected from terminal 1208 to terminal 1209 and capacitor C4 is connected from terminal 1212 to 1214. In this hold operation, the voltage $V_{A2}$ equals the voltage, $V_{OP}$-$V_{ON}$, that had occurred previously in phase $\Phi_{1A}$. Simultaneously, capacitors C1 and C2 develop a charge proportional to $V_{A2}$, since amplifier A1 terminals 1202, 1205 are providing a virtual signal ground due the negative feedback connection of terminals 1201 to 1202 and terminals 1204 to 1205. Additionally, capacitors C7 and C8 develop a charge proportional to $V_{IN1}$ and capacitors C9 and C10 develop a charge proportional to $V_{IN2}$.

The circuit constructed with amplifier A1 is a sample and hold circuit free from any operational amplifier offset (offset free) of A1. Sample and hold circuits are used to sample an analog signal at a particular instant of time and hold the value of the sample as long as required. The sampling instant and hold duration for sample and hold circuits are determined by a logic control signal, wherein the hold interval must be long enough for either an analog to digital conversion to take place or for another circuit to sample the held value. Essentially the first amplifying circuit with A1 implements summation of inputs $V_{IN1}$ and $V_{IN2}$ with prior stored values from $V_{A2}$ and the result is held at terminals $V_{OP}$ and $V_{ON}$. The delay from $V_{A2}$ to $V_{OP}$, $V_{ON}$ is $z^{-\frac{1}{2}}$. Similarly, the delay from $V_{IN1}$ and $V_{IN2}$ to $V_{OP}$, $V_{ON}$ is $z^{-\frac{1}{2}}$.

Figure 14:
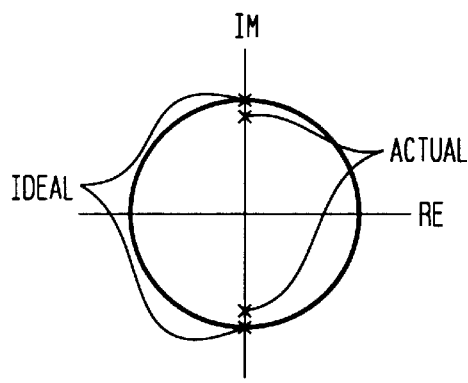
FIG. 14 is a z-plane diagram for the circuit of FIG. 12.
Figure 15:
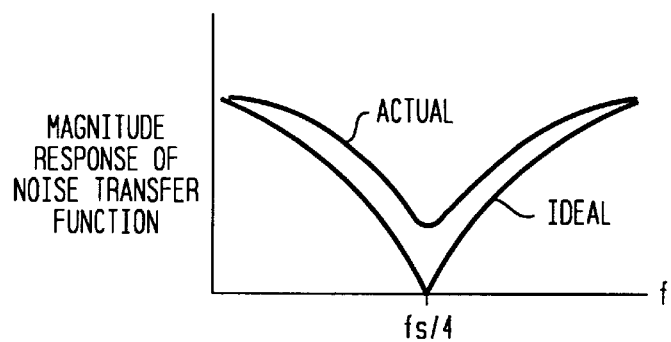
FIG. 15 is the frequency response of the magnitude of the noise transfer function of the circuit of FIG. 4, with resonators implemented as shown in FIG. 12.

Amplifier $A_2$ implements two offset free sample/hold functions with a $z^{-\frac{1}{2}}$ delay by clocking phase switches $\Phi_{1A}$, $\Phi_{1B}$, $\Phi_{2A}$, and $\Phi_{2B}$. For example, $V_{OP}$, $V_{ON}$ is sampled with capacitors C3 and C4 during $\Phi_{1A}$ and is not placed at $V_{A2}$ until $\Phi_{2A}$ switches. During $\Phi_{2A}$, $V_{A2}$ is sampled by C1 and C2 and finally during $\Phi_1$ is held at $V_{OP}$, $V_{ON}$ for a total loop delay of 2 clock periods. The total delay $z^{-2}$ is independent of the values of capacitors C1 through C6 and hence the poles are placed at $z=\pm j$ at a frequency $f=f_s/4$, as desired. Finite operational amplifier gain will cause the poles to be slightly inside the unit circles as shown in FIG. 14, but this peak in the frequency response will still occur at $f=f_s/4$. The frequency response of the sigma-delta noise transfer function will be as shown in FIG. 15 with a frequency at $f_s/4$, as desired. This circuit is independent of capacitor values for implementation of the loop gain and $z^{-2}$ for pole placement, however, the input signal summation and gain to the output terminals does depend on ratios between capacitors C7 through C10 to capacitors C1 and C2. An error of a couple of percent here has no consequential effect to the resulting noise transfer function of the sigma-delta A/D converter.

Figure 16:
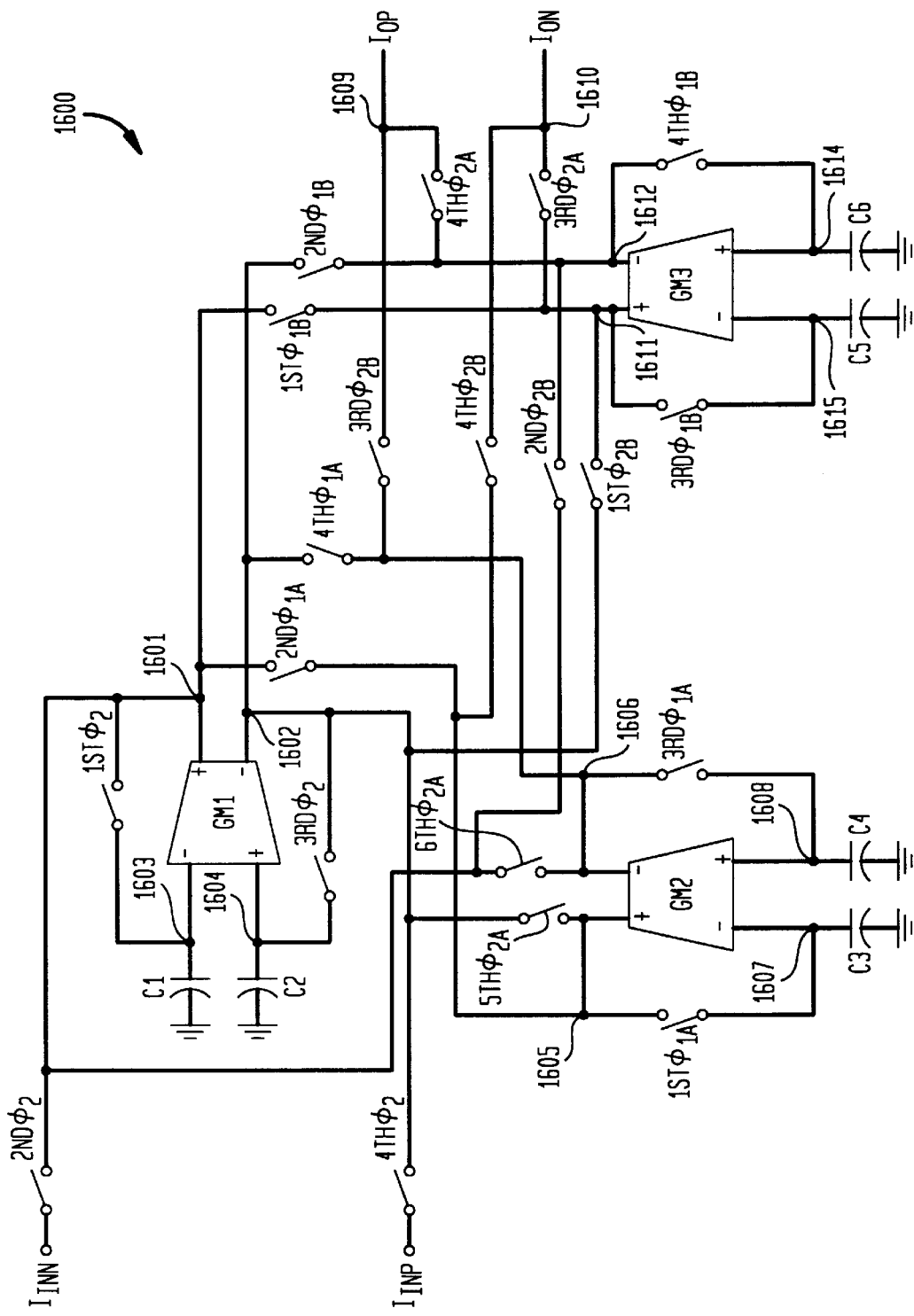
FIG. 16 is a current copier circuit implementation of the resonator block diagram of FIG. 11.

Referring now to FIG. 16 there is shown a current copier based circuit 1600 and associated capacitors for implementing the resonator function block $z^{-1}/(1+z^{-2})$ with one differential input signal and multiple unit delays. Current copiers are essentially analog memory circuits that store/remember currents rather than voltages. Alternatively, they can be viewed as sample and hold circuits for currents. Current Copier CC1 includes transconductance amplifier GM1, capacitors C1 and C2, and phase 2 switches in the feedback loop. Current Copier CC2 includes transconductance amplifier GM2, capacitors C3 and C4, and phase 1A switches in the feedback loop. Current Copier CC3 includes transconductance amplifier GM3, capacitors C5 and C6, and phase 1B switches in the feedback loop.

Transconductance amplifier GM1 is shunted by a phase 2 ($\Phi 2$) switch across terminals 1603, the inverting input terminal to GM1, and 1601, the noninverting output terminal of GM1. A capacitor C1 is connected at one end to terminal 1603 and connected to a signal ground at the other end. Transconductance amplifier GM1 is shunted by a phase 2 ($\Phi 2$) switch across terminals 1604, the noninverting input terminal to GM1, and 1602, the inverting output terminal of GM1. A capacitor C2 is connected at one end to terminal 1604 and to a signal ground at the other end. Input signal $I_{INN}$ is applied at a phase two ($\Phi 2$) switch which at its other end is connected to terminal 1601. The other input signal $I_{INP}$ is applied to a phase 2 ($\Phi 2$) switch which at its other end is connected to terminal 1602.

Transconductance amplifier GM2 is shunted by a phase 1A ($\Phi A$) switch across terminals 1607, the inverting input terminal of GM2, and 1605, the noninverting output terminal of GM2. A capacitor C3 is connected at one end to terminal 1607 and at the other end to a signal ground. Transconductance amplifier GM2 is shunted by a phase 1A ($\Phi A$) switch across terminals 1608, the noninverting input terminal to GM2, and 1606, the inverting output terminal of GM2. A capacitor C4 is connected at one end to terminal 1608 of transconductance amplifier GM2 and at the other end to a signal ground. Terminal 1605 is connected to a, phase 2A ($\Phi 2A$) switch which at its other end is connected to terminal 1602. Terminal 1605 is also connected to a phase 1A ($\Phi 1A$) switch which at its other end is connected to terminal 1601. Terminal 1606 is connected to a phase 2A (Φ2A) switch which at its other end is connected to terminal 1601. Terminal 1606 is also connected to a phase 1A (Φ1A) switch which at its other end is connected to terminal 1602. Terminal 1606 is also connected to a phase 2B (Φ2B) switch which at its other end is connected to an output terminal 1609 for $I_{OP}$, and terminal 1605 is also connected to a phase 2B (Φ2B) switch which at its other end is connected to an output terminal 1610 for $I_{ON}$.

Transconductance amplifier GM3 is shunted by a phase 1B (Φ1B) switch across terminals 1615, the inverting input terminal of GM3, and 1611, the noninverting output terminal of GM3. A capacitor C5 is connected at one end to terminal 1615 and at the other end to a signal ground. Transconductance amplifier GM3 is shunted by a phase 1B (Φ1B) switch across terminals 1614, the noninverting input terminal to GM3, and 1612, the inverting output terminal of GM3. A capacitor C6 is connected at one end to terminal 1614 and to a signal ground at the other end. Terminal 1611 is connected to a phase 2B (Φ2B) switch which at its other end is connected to terminal 1602. Terminal 1611 is also connected to a phase 2A (Φ2A) switch which at its other end is connected to output terminal 1610 for $I_{ON}$. Terminal 1611 is also connected to a phase 1B (Φ1B) switch which at its other end is connected to terminal 1601. Terminal 1612 is connected to a phase 2B (Φ2B) switch which at its other end is connected to terminal 1601. Terminal 1612 is also connected to a phase 1B (Φ1B) switch which at its other end is connected to terminal 1602. Terminal 1612 is also connected to a phase 2A (Φ2A) switch which at its other end is connected to output terminal 1609 for $I_{OP}$.

Figure 17:
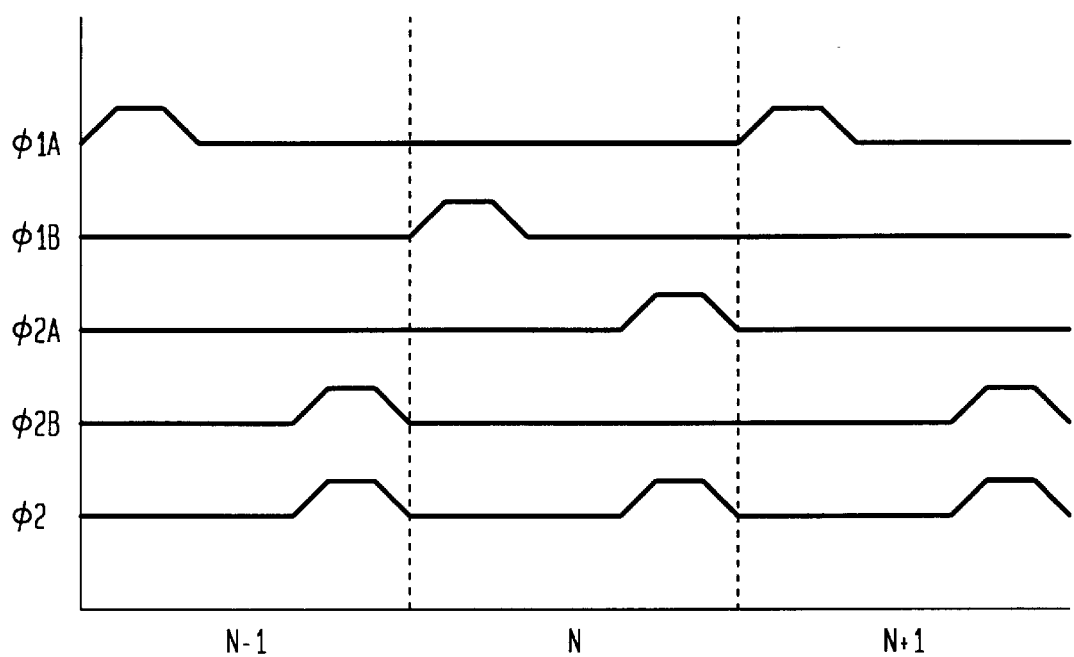
FIG. 17 is a timing diagram for the switches in the circuit of FIG. 16.

Current copier CC1 (GM1, capacitors C1 and C2, and feedback switches (Φ2) samples every clock period for $\Phi_2$ switching and adds the current from the input terminals ($I_{INP}$ and $I_{INN}$) to either the current stored in current copiers CC2 (GM2, C3, C4 and $\Phi_{1A}$ switches) or CC3 (GM3, C5, C6 and phase $\Phi_{1B}$ switches) depending on whether the A or B phase switching of clock 2, respectively is active. In accordance with the timing diagram shown in FIG. 17, changes in the phase switches occur as follows: $\Phi_2$ and $\Phi_{2B}$ for inputting $I_{INP}/I_{INN}$ to GM1 for summation with GM3 outputs, and sending GM2 outputs to $I_{ON}/I_{OP}$; $\Phi_2$ and $\Phi_{2A}$ for inputting $I_{INP}/I_{INN}$ to GM1 for summation with GM2 outputs, and sending GM3 outputs to $I_{ON}/I_{OP}$; $\Phi_{1A}$ switching for transferring the current held in CC1 to CC2; and $\Phi_{1B}$ switching is used to transfer the current from the current held in CC1 to current copier CC3. The multiple clocking phase achieves a full clock period delay from the input to the output terminals of the resonator and achieves a delay of two around the feedback loop to exactly implement the equation $I_{OUT}(n)=I_{IN}[n-1]-I_{OUT}[n-2]$ as diagrammed with the transfer function loop shown in FIG. 11. During phase $\Phi_2$ switching the resonator inputs are sampled and during phase $\Phi_{1B}$ the current held by CC1 is copied by CC3. During phase $\Phi_{2A}$ switching, the current in CC3 is directed to the output terminals implementing a $z^{-1}$ delay from input to output. A full clock cycle later, the current in CC3 is sent to CC1 during $\Phi_{2B}$ switching to be copied and added to the new input sample, realizing a total loop delay of $z^{-2}$. Current copier CC2 operates in the same way as CC3 with different clock phases. This design is ratio independent since these current copiers simply copy and delay signals without scaling. Imperfect copying, due to finite output impedance of the transconductance amplifier, can cause some loss of signal in the copying process. Since the delay around the main loop remains $z^{-2}$, the nonideal copying will prevent the poles from being exactly on the unit circle, slightly inside as for the circuit in FIG. 12. The sigma-delta noise transfer function will have the notch at $f=f_s/4$, but the attenuation of the quantization noise will be finite with the response of FIGS. 14 and 15 applicable to the current copier implementation.

Numerous modifications and alternative embodiments of the invention will be apparent to those skilled in the art in view of the foregoing description. For example, the switched capacitor and current copier approaches are disclosed as fully differential (also called balanced), however, these approaches could alternatively be implemented as single ended designs. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed:

1. An integrated circuit device including a sigma delta analog-to-digital converter, said analog-to-digital converter having at least one resonator circuit, said resonator circuit including at least one input terminal for receiving at least one input signal thereon, said resonator circuit comprising:

a first sample and hold circuit having at least one input terminal and at least one output terminal, said first sample and hold sampling said input signal at said input terminal according to a first sampling frequency and holding said input signal at said output terminal, said input signal becoming available at said output terminal after a first delay interval; and a second sample and hold circuit coupled in feedback loop between said output terminal and said input terminal of said first sample and hold circuit, said second sample and hold circuit sampling according to a second sampling frequency and operable to delay output of a signal input thereto by a second delay interval, wherein said first sample and hold circuit is operable to implement a summation between an output of said second sample and hold circuit and said input signal input to said first sample and hold circuit.

2. The device of claim 1, further including:

a third sample and hold circuit coupled in a feedback loop between said output terminal of said first sample and hold circuit and said input terminal of said first sample and hold circuit, said third sample and hold circuit sampling according to said second sampling frequency and operable to delay output of a signal input thereto by said second delay interval, wherein said first sample and hold circuit is operable to implement a summation between an output of said third sample and hold circuit and said input signal input to said first sample and hold circuit said second and third sample and hold circuits being alternately coupled in said feedback loop according to said second sampling frequency.

3. The device of claim 2, wherein said first sample and hold circuit includes a first operational amplifier and said second and third sample and hold circuit share a second common operational amplifier, each said sample and hold circuit being substantially offset free.

4. The device of claim 2, wherein said first sample and hold circuit includes a first transconductance amplifier with inverting and noninverting input and output terminals and a first capacitor coupled at one end to a signal ground and at the other end coupled to said inverting input terminal and a first phase two switch, said first phase two switch being coupled to said noninverting output terminal and a second phase two switch in turn being coupled to a first of said at least one input signal.

5. The device of claim 4, wherein said first transconductance amplifier includes a second capacitor at one end coupled to a signal ground and at the other end coupled to said noninverting input terminal and a third phase two switch, said third phase two switch being coupled to said inverting output terminal and a fourth phase two switch, said fourth phase two switch in turn being coupled to a second of said at least one input signal.

6. The device of claim 5, wherein said second sample and hold circuit includes a second transconductance amplifier with inverting and noninverting input and output terminals and a third capacitor coupled at one end to a signal ground and the other end coupled to said inverting input terminal and a first phase 1A switch in turn coupled to said noninverting output terminal, said noninverting output terminal being coupled to a second phase 1A switch in turn being coupled to said noninverting output terminal of said first amplifier, said noninverting output terminal being coupled to a first phase 2B switch, e.g., ($4\phi_{2B}$) in turn being coupled to an output for said resonator circuit, said noninverting output terminal being coupled to a first phase 2A switch, e.g., ($5\phi_{2A}$) in turn being coupled to said inverting output terminal and third and fourth phase two switches of said first amplifier.

7. The device of claim 6, wherein said second transconductance amplifier includes a fourth capacitor at one end coupled to a signal ground and at the other end coupled to said noninverting input terminal and a third phase 1A switch in turn coupled to said inverting output terminal, said inverting output terminal being coupled to a fourth phase 1A switch in turn being coupled to said inverting output terminal of said first amplifier, said inverting output terminal being coupled to a second phase 2B switch, e.g., ($3\phi_{2B}$) in turn being coupled to another said output for said circuit, said inverting output terminal being coupled to a second phase 2A switch, e.g., ($6\phi_{2A}$) in turn being coupled to said noninverting output terminal and first and second phase two switches of said first amplifier.

8. The device of claim 6, wherein said third sample and hold circuit includes a third transconductance amplifier with inverting and noninverting input and output terminals and a fifth capacitor at one end coupled to a signal ground and at the other end coupled to said inverting input terminal and a first phase 1B switch, e.g., ($3\phi_{1B}$) in turn being coupled to said noninverting output terminal, said noninverting output terminal being coupled to a second phase 1B switch, e.g., ($1\phi_{1B}$) in turn being coupled to said noninverting output terminal of said first amplifier, said noninverting output terminal being coupled to a third phase 2A switch, e.g., ($3\phi_{2A}$) in turn being coupled to the circuit output, said noninverting output terminal being coupled to a third phase 2B switch, e.g., ($1\phi_{2B}$) in turn being coupled to said inverting output terminal and third and fourth phase two switches of said first amplifier.

9. The device of claim 8, wherein said third transconductance amplifier includes a sixth capacitor at one end coupled to a signal ground and at the other end coupled to said noninverting input terminal and a third phase 1B switch, e.g., ($4\phi_{1B}$) in turn being coupled to said inverting output terminal, said inverting output terminal being coupled to a fourth phase 1B switch, e.g., ($2\phi_{1B}$) in being turn coupled to said inverting output terminal of said first means, said inverting output terminal being coupled to a fourth phase 2A switch in turn being coupled to another terminal of said circuit output, said inverting output terminal being coupled to a fourth phase 2B switch, e.g., ($2\phi_{2B}$) in turn coupled to said noninverting output terminal, first and second phase two switches of said first amplifier.

10. The device according to claim 9, wherein the phase two and phase 2B switches are operable for inputting said at least one input signal to said first transconductance amplifier for said given summation with outputs from said third transconductance amplifier, and transferring outputs from said second transconductance amplifier as outputs for the resonator circuit.

11. The circuit according to claim 9, wherein the phase two and phase 2A switches are operable for inputting said at least one input signal to said first transconductance amplifier for said given summation with outputs from said second transconductance amplifier, and transferring outputs from said third transconductance amplifier as outputs for the resonator circuit.

12. The device according to claim 9, wherein the phase 1A switches are operable to transfer current held in said first amplifier circuit to said second amplifier circuit.

13. The circuit according to claim 9, wherein the phase 1B switches are operable to transfer current held in said first amplifier circuit to said third amplifier circuit.

14. The device of claim 2, wherein said resonator circuit is operable to implement a transfer function defined as $(z^{-1})/(1+z^{-2})$.

15. The device of claim 1, wherein said first delay interval and said second delay interval are unit delays.

16. The device of claim 1, wherein said second sampling frequency is one half of said first sampling frequency.

17. The device of claim 1, wherein said analog-to-digital converter provides a noise transfer function having transmission zeroes at approximately $f=f_s/4$, where $f_s$ is a sampling frequency.

18. The device of claim 1, wherein said resonator circuit is operable to implement a transfer function defined as $(z^{-\frac{1}{2}})/(1+z^{-2})$.

19. The device of claim 1, further including a plurality of phase switches coupled to said first and second sample and hold circuit, said phase switches being selectively operable to operation of said first and second sample and hold circuit.

20. The device of claim 1, wherein said first sample and hold circuit includes a first amplifier having an inverting and a noninverting input and an output, said inverting input being coupled to a first capacitor and a first phase two switch, e.g., ($1\phi_2$), said first capacitor being coupled to a first phase one switch, e.g., ($1\phi_1$) and a second phase two switch, e.g., ($3\phi_2$), said first phase one switch coupled to said output and said first phase two switch, wherein a phase one and phase two switch are operable during respective phases to provide said sampling and holding.

21. The device of claim 20, wherein said first amplifier circuit includes said inverting input being coupled to a second capacitor, e.g., (C7) and a third capacitor, e.g., (C9), said second capacitor being coupled to a second phase one switch, e.g., ($5\phi_1$) and a third phase two switch, e.g., ($5\phi_2$), said third phase two switch in turn being coupled to a positive potential of a first input signal, said third capacitor being coupled to a third phase one switch, e.g., ($7\phi_1$) and a fourth phase two switch, e.g., ($7\phi_2$), said fourth phase two switch in turn being coupled to a positive potential of a second input signal.

22. The device of claim 21, wherein said first amplifier circuit includes said noninverting input of said first amplifier being coupled to a fourth capacitor, e.g., (C2) and a fifth phase two switch, e.g., ($2\phi_2$), said fourth capacitor being coupled to a fourth phase one switch, e.g., ($2\phi_1$) and a sixth phase two switch, e.g., ($4\phi_2$), said fourth phase one switch being coupled to an inverting output of said first amplifier and said fifth phase two switch.

23. The device of claim 22, wherein said first amplifier circuit includes said noninverting input being coupled to a fifth capacitor, e.g., (C8) and a sixth capacitor, e.g., (C10), said fifth capacitor being coupled to a fifth phase one switch, e.g., ($6\phi_1$) and a seventh phase two switch, e.g., ($6\phi_2$), said seventh phase two switch in turn being coupled to a negative potential of said first input signal, said sixth capacitor being coupled to a sixth phase one switch, e.g., ($8\phi_1$) and an eighth phase two switch, e.g., ($8\phi_2$), said eighth phase two switch in turn being coupled to a negative potential of said second input signal, said second phase one switch being coupled to said seventh phase two switch, and said third phase one switch being coupled to said eighth phase two switch.

24. The device of claim 23, wherein said second sample and hold circuit includes a second amplifier having inverting and noninverting inputs and inverting and noninverting outputs and a seventh capacitor, e.g., (C3) being coupled to said inverting input, an eighth capacitor, e.g., (C5) and a seventh phase one switch, e.g., ($3\phi_1$), said seventh phase one switch in turn being coupled to said noninverting output, said seventh capacitor being coupled to a first phase 2A switch and a first phase 1A switch, said first phase 2A switch being coupled to said noninverting output and said seventh phase one switch, said first phase 1A switch being coupled to said noninverting output of said first amplifier, said eighth capacitor being coupled to a second phase 2B switch and a first phase 1B switch, said second phase 2B switch being coupled to said noninverting output, said first phase 2A switch and said seventh phase one switch, said first phase 1B switch being coupled to said noninverting output of said first amplifier, said inverting and noninverting outputs of said second amplifier being coupled to said second and sixth phase two switches, respectively.

25. The device of claim 24, wherein said second sample and hold circuit includes a ninth capacitor, e.g., (C4) coupled to said noninverting input of said second amplifier, a tenth capacitor, e.g., (C6) and a eighth phase one switch, e.g., ($4\phi_1$), said eighth phase one switch in turn being coupled to said inverting output of said second amplifier, said ninth capacitor being coupled to a second phase 2A switch and a second phase 1A switch, said second phase 2A switch being coupled to said inverting output and said eighth phase one switch, said second phase 1A switch being coupled to said inverting output of said first amplifier, said tenth capacitor being coupled to a first phase 2B switch and a second phase 1B switch, said first phase 2B switch being coupled to said inverting output, said second phase 2A switch and said eighth phase one switch, said second phase 1B switch being coupled to said inverting output of said first amplifier.

26. The device of claim 25, wherein the phase one switches are operable to produce a weighted summation of the output from said second amplifier circuit and said at least one input signal.

27. The device of claim 26, wherein the phase two and phase 2B switches are operable to produce a given hold of the voltage from the output of said first amplifier at the output of said second amplifier.

28. The device of claim 18, wherein the phase two and phase 2A switches are operable to produce a given hold of the voltage from the output of said first amplifier at the output of said second amplifier.

29. The circuit according to claim 1, wherein said resonator circuit implements transfer function poles on a complex plane diagram at approximately $z=+/-j$.

30. The device of claim 1, wherein said first sample and hold circuit and said second sample and hold circuit include at least one switched capacitor circuit for implementing said delay intervals.

31. The device of claim 1, wherein said first sample and hold circuit and said second sample and hold circuit include at least one current copier circuit for implementing said delay intervals.

32. A method of operating a resonator circuit included in a sigma delta analog-to-digital converter, said method comprising the steps of sampling a signal at at least one input terminal of a first sample and hold circuit according to a first sampling frequency and holding said signal at at least one output terminal thereof, said signal becoming available at said output terminal after a first delay interval; and sampling a second sample and hold circuit according to a second sampling frequency and delaying output of a signal input thereto by a second delay interval, said second sample and hold circuit being coupled in a feedback loop between said output terminal and said input terminal of said first sample and hold circuit, wherein said first sample and hold circuit is operable to implement a summation between an output of said second sample and hold circuit and said input signal input to said first sample and hold circuit.

33. The method of claim 32, further including the step of, sampling a third sample and hold circuit coupled in a feedback loop between said output terminal and said input terminal of said first sample and hold circuit according to a second sampling frequency and delaying output of a signal input thereto by a second delay interval, wherein said first sample and hold circuit is operable to implement a summation between an output of said third sample and hold circuit and said input signal input to said first sample and hold circuit, said second and third sample and hold circuit being alternately coupled in said feedback according to said second sampling frequency.

34. The method of claim 33, wherein said resonator circuit is operable to implement a transfer function defined as $(z^{-1})/(1+z^{-2})$.

35. The method of claim 32, wherein said resonator circuit is operable to implement a transfer function defined as $(z^{-\frac{1}{2}})/(1+z^{-2})$.

36. The method of claim 32, wherein said analog-to-digital converter provides a noise transfer function having transmission zeroes at approximately $f=f_s/4$, where $f_s$ is a sampling frequency.

* * * * *